United States Patent [19]
Singers et al.

[11] Patent Number: 5,973,662
[45] Date of Patent: Oct. 26, 1999

[54] ANALOG SPECTRUM DISPLAY FOR ENVIRONMENTAL CONTROL

[75] Inventors: Robert R. Singers, Brown Deer; Michael Piotrowski, St. Francis; Jeffrey J. Gloudeman, Franklin, all of Wis.

[73] Assignee: Johnson Controls Technology Company, Plymouth, Mich.

[21] Appl. No.: 08/838,482

[22] Filed: Apr. 7, 1997

[51] Int. Cl.$^6$ .................................................. G09G 5/00
[52] U.S. Cl. ................ 345/112; 364/528.11; 364/528.12
[58] Field of Search .................................. 345/133, 440, 345/112; 348/906; 364/528.11, 528.12

[56] References Cited

U.S. PATENT DOCUMENTS

| | | | |
|---|---|---|---|
| 5,664,084 | 9/1997 | Smith | 345/440 |
| 5,682,329 | 10/1997 | Seem et al. | 364/581 |
| 5,777,598 | 7/1998 | Gowda et al. | 345/440 |

*Primary Examiner*—Bipin H. Shalwala
*Assistant Examiner*—Kent Chang
*Attorney, Agent, or Firm*—Quarles & Brady LLP

[57] ABSTRACT

A computer implemented environmental process control apparatus for displaying the condition of selected attributes of a plurality of environmental control components or zones within a facility. One embodiment of the apparatus is configured to create a river of time display including a rivulet having an historical and future data segment corresponding to each of the plurality of components or zones. In order to create the river of time, the apparatus includes a memory having a plurality of first instances of a data structure and a plurality of second instances of a data structure for storing historical and future data, respectively, means for establishing a look back value, means for establishing a look forward value, an historical data processing module, a future data processing module, a graphic engine, and a data access logic device. The historical and future data processing modules receive and commnunicate historical and future data, respectively, to the first and second instances of the data structure. The data entries are then selectively retrieved by the data access logic device and communicated to the graphic engine such that the graphic engine creates the river of time display over a time interval that the data access logic device calculates based upon the look back and look forward values.

27 Claims, 4 Drawing Sheets

5,973,662

ANALOG SPECTRUM DISPLAY FOR ENVIRONMENTAL CONTROL

BACKGROUND OF THE INVENTION

1. Technical Field

This invention generally relates to an apparatus for displaying the condition of a plurality of zones or components. More particularly, the invention relates to a computer implemented environmental process control apparatus that communicates with a plurality of control components or environmental zones in a facility and is adapted to display the condition of each component or zone in a manner that allows the facility operator to recognize trends and relationships in the data.

2. Discussion

It is not unusual for modern buildings to include heating, ventilation and air conditioning (HVAC) systems that contain in excess of 400,000 set and control points. Accordingly, as the operation of these systems often requires significant human involvement, effective management of facilities with HVAC systems requires an operator interface that displays or otherwise communicates the status of each system component or zone in a manner that is understandable by the operator. Particularly, the operator interface of the facility management system should display information relating to the condition in each of the zones, the status and state of the system controlled components, and related data in a manner that allows the operator to recognize trends and relationships in the data. A holistic view of the zones and components within the system allows the operator to quickly determine the state of the various components of the facility and to take a pro-active stance before alarms report, equipment fails, or people start calling in complaints.

Commonly, prior art systems display the relevant facility information with traditional line graphs and the like. However, given the flood of information generated by facility sensors and components, line graphs are unable to clearly convey a visual display of the necessary information to the operator. As a result, multiple line graphs with overlays or similar complicating features have proven to be an unacceptable display option particularly for large HVAC systems.

SUMMARY OF THE INVENTION

The present invention overcomes the disadvantages associated with operator interfaces for facility management systems by providing a computer implemented environmental process control apparatus that displays selected state, event, or condition data related to each of a plurality of environmental zones in a manner that allows the operator to readily perceive the malfunctioning of any HVAC components or the presence of undesirable conditions within the system.

In one embodiment of the present invention, the computer implemented environmental process control apparatus is configured to create a river of time including a plurality of rivulets corresponding to the plurality of components or zones of the facility. The river of time simultaneously displays both historical and future data relating to each component or zone thereby allowing the operator to analyze the scheduled operation of the system components in relation to current and past data. In order to create the river of time display, the control apparatus preferably includes a memory for storing historical and future data for each of the n plurality of components of the facility management system, an historical and a future data processing module adapted to receive field and user input, respectively, and to communicate the input to the respective data structures, a graphic engine for generating the display, and a data access logic device adapted to access and communicate data stored in the system to the graphic engine such that the graphic engine creates a plurality of rivulets displayed about a real time axis. Each of the rivulets include an historical data segment extending in a first direction from the real time axis and a future data segment extending in a second direction from the axis. The computer implemented environmental process control apparatus further includes a time of day clock, means for establishing a look back value, and means for establishing a look forward value whereby the apparatus is configured to define a time interval over which to display the rivulets.

In another preferred embodiment of the present invention, the computer implemented environmental process control apparatus is configured to graphically display the magnitude of the departure of a measured value from a set point and, optionally, a rate of change of the departure value and/or a second measured value for each or several of the plurality of zones or components. The control apparatus preferably includes a memory, a data processing module adapted to receive and convey measured values to the memory as data entries, means for establishing a set point, a graphic engine for creating the display, and a data access logic device for accessing and conveying the stored information to the graphic engine such that the graphic engine displays a plurality of segments normalized to and extending from a first axis thereby indicating the magnitude of the departure values.

BRIEF DESCRIPTION OF THE DRAWINGS

The objects and features of this invention will become apparent from a reading of the following detailed description taken in conjunction with the drawings in which.

DETAILED DESCRIPTION OF THE PREFERRED EMBODIMENTS

Figure 1:
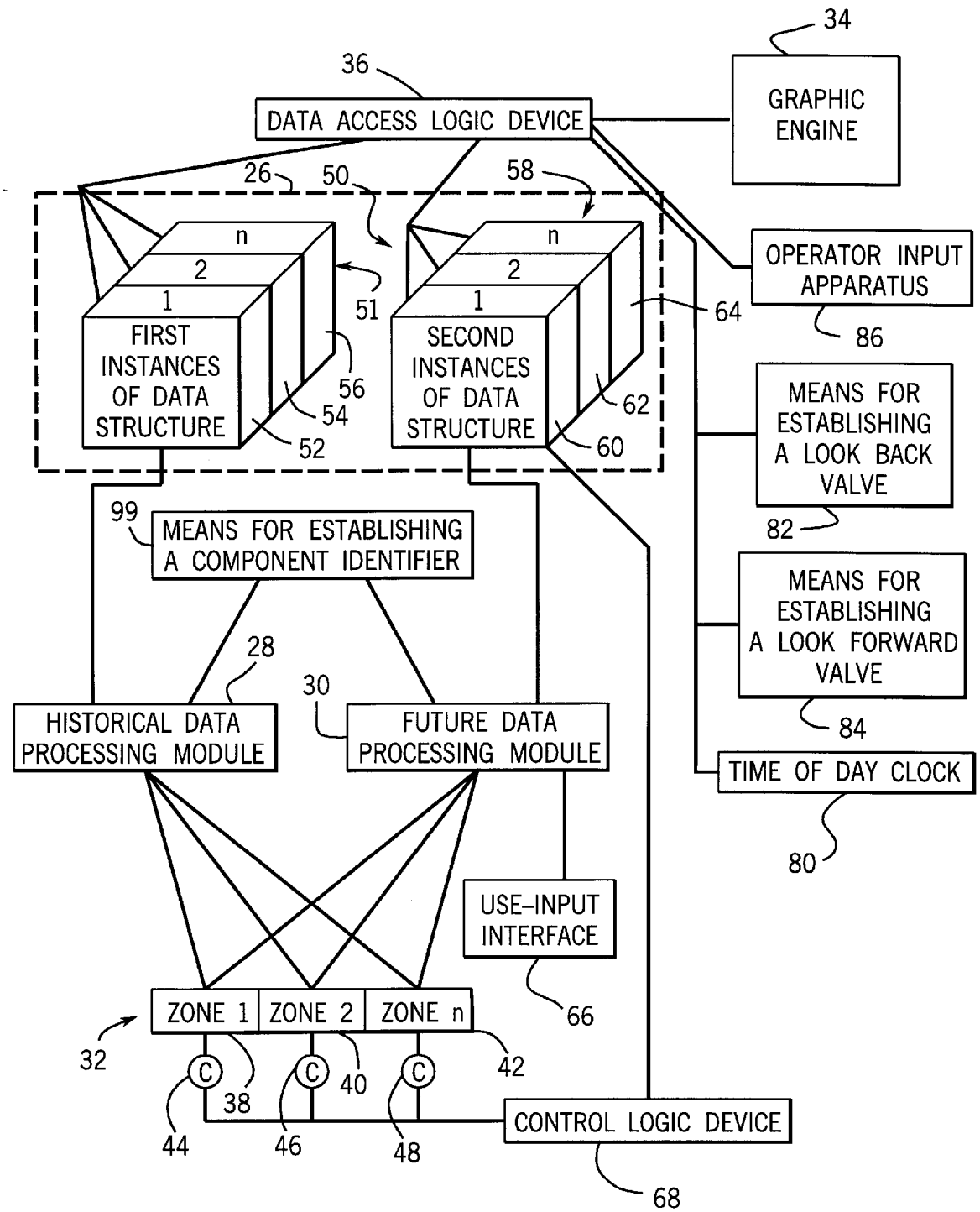
FIG. 1 is a schematic representation of the computer implemented environmental process control apparatus.
Figure 2:
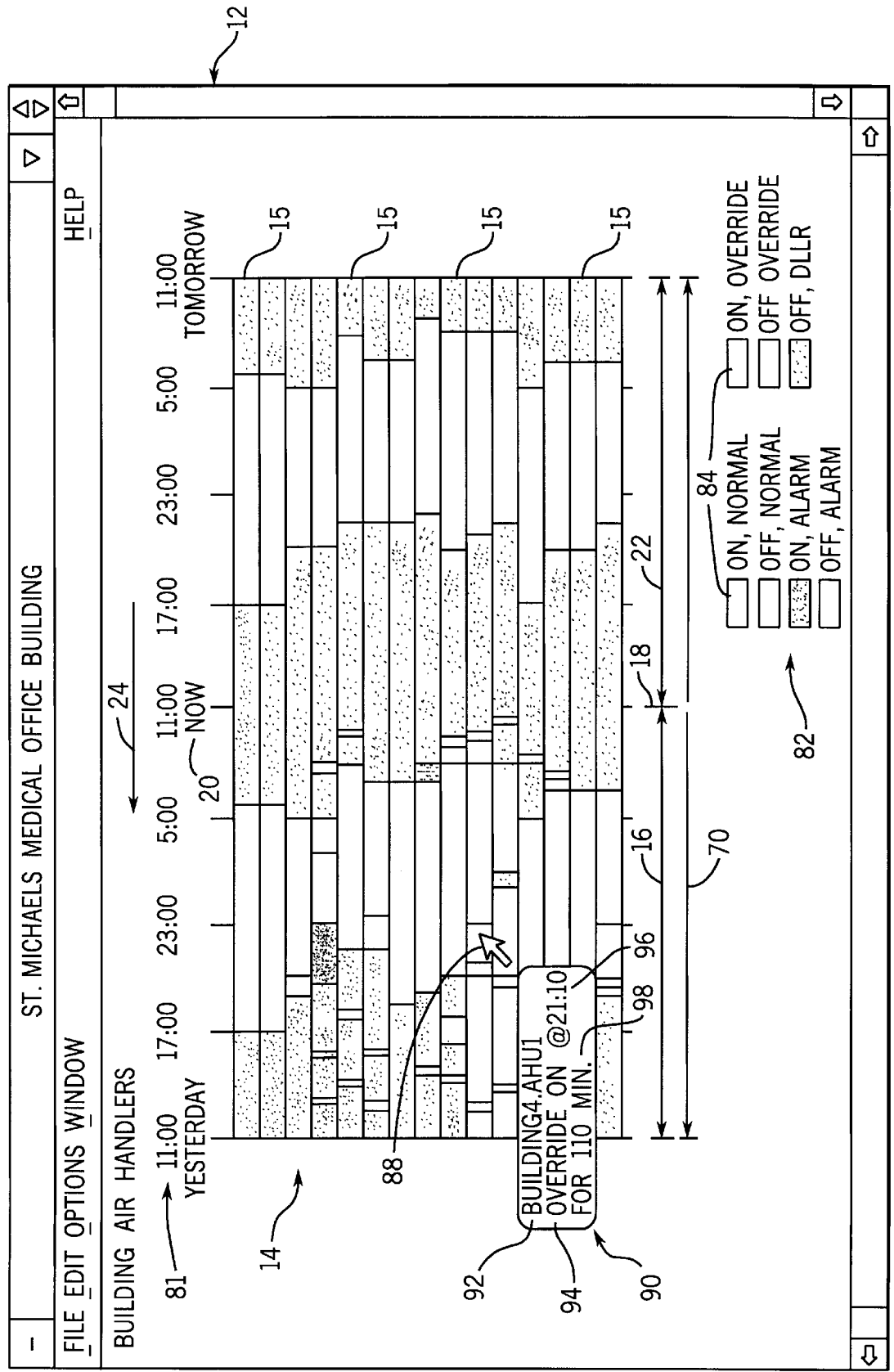
FIG. 2 illustrates a display generated by the control apparatus schematically illustrated in FIG. 1.

FIG. 1 illustrates a computer implemented environmental process control apparatus 10 for generating the display window 12 shown in FIG. 2 including a river of time 14. As will be explained in greater detail below, river of time 14 provides an holistic view of both the past and future conditions for each of the plurality of environmental zones or components illustrated in the display. More particularly, river of time 14 is formed by a plurality of rivulets 15 each representing a zone or component in the HVAC system. Each rivulet includes an historical data segment 16 extending in a first direction from a time of day axis 18 that is preferably indicated within window 12 by a "now" label 20. In a similar fashion, a future data segment 22 extends from real time axis 18 in a second direction opposite the first direction. Accordingly, those skilled in the art will appreciate that as river of time 14 is repeatedly generated and regenerated over time, the river of data appears to "flow" from the future data segment 22 to the historical data segment 16 in the direction indicated by arrow 24. It will be further appreciated by those skilled in the art that the river of time display may be oriented in a variety of configurations or modified to "flow" in a variety of directions.

Turning now to the configuration of computer implemented environmental process control apparatus illustrated in FIG. 1, apparatus 10 includes a memory 26, a historical data processing module 28 and a future data processing module 30 each communicating with a plurality of zones defining a facility 32, a graphic engine 34, and a data access logic device 36 communicating with memory 26 and graphic engine 34. Facility 32 is represented in FIG. 1 by zones 1, 2, and n generally indicated by reference numerals 38, 40, and 42, respectively. Each of zones 1, 2, and n communicate with a control component 44, 46, and 48, respectively, and include a sensor or other signaling device (not shown) that communicates with historical data processing module 28 and future data processing module 30.

Historical data processing module 28 is adapted to receive input signals such as attribute condition signals from each of components 44, 46, and 48, respectively, and to convey the input data as data entries to selected portions of memory 26. In the preferred embodiment, apparatus 10 is configured to monitor and control each of a plurality of system components such as fans, condensers, etc. Accordingly, each data entry preferably includes an attribute condition and a corresponding start and end time for the attribute condition. It is contemplated that, in the case where the monitored component is a fan, an attribute condition may include the fan state (on/off), fan status (normal/abnormal), and the like as well as the event that causes a change in condition, e.g., energy management, time schedule, manual intervention, or failure of equipment. However, from this description and the appended drawings, those skilled in the art will appreciate that apparatus 10 may be modified to monitor and/or control any number and type of system components, conditions, and the like.

Memory 26 preferably includes a data structure 50 for storing the plurality of data entries for each of the plurality of components 44, 46, and 48, respectively, or condition measurements corresponding to the plurality of zones 38, 40, and 42. In the preferred embodiment, memory 26 includes a plurality of first instances 51 of data structure 50 which are shown in FIG. 1 to include a first instance 52 corresponding to first zone 38 or first component 44, a first instance 54 corresponding to second zone 40 or second component 46, and an n-th first instance 56 corresponding to zone n 42 or component n 48. In a manner known in the art, historical data processing module 28 is adapted to receive an attribute condition indicating signal from one or several of the n components 44, 46, and 48 and to communicate the historical data to the respective first instances 52, 54, and 56, respectively, of data structure 50 in the form of the data entries.

In the preferred embodiment, memory 26 further includes a plurality of second instances 58 of data structure 50 for storing future data for each of the n plurality of environmental zones 38, 40, and 42 and/or components 44, 46, and 48. Second instances 58 of data structure 50 include a second instance 60 corresponding to first zone 38 and/or component 44 of facility 32, a second instance 62 corresponding to second zone 40 and/or component 46, and an n-th second instance 64 corresponding to zone n 42 and/or component n 48. Future data processing module 30 communicates with a user input interface 66 whereby future data processing module 30 receives user input corresponding to the desired attribute conditions of each component 44, 46, and 48 and/or zone 38, 40, and 42. Module 30 is coupled to communicate the user input to the respective second instances 60, 62, and 64, respectively of the data structure. In this manner, computer implemented environmental process control apparatus 10 is adapted to receive, store, and manipulate a component control schedule.

Optionally, a control logic device 68 may be provided to communicate with second instances 58 of data structure 50 and each of the plurality of zones or components within facility 32. Control logic device 68 is configured to access and monitor the future data entries stored in second instances 60, 62, and 64 of data structure 50, to determine when a change in a component attribute is required, and to send a control signal to the appropriate component to effect the change. As a result, control logic device 68 automatically implements the control schedule stored in second instances 58 of data structure 50.

Data access logic device 36 is configured to access historical and future data from each of the plurality of first instances 50 and second instances 58 of data structure 50 and communicate selected historical and future data entries to graphic engine 34 such that graphic engine 34 creates river of time 14 as previously described. Specifically, data access logic device 36 is adapted to access and convey the attribute condition for selected zones and/or components within facility 32 over a determined time interval 70 (FIG. 2). In order to provide the necessary time reference, computer implemented environmental process control apparatus 10 further includes a time of day clock 80, means 82 for establishing a look back value, and means 84 for establishing a look forward value. It will be appreciated by those skilled in the art that the means for establishing the look back value and the look forward value may include a variety of operator input arrangements including a keyboard, touch screen, or mouse whereby an operator or programmer may provide a permanent or adjustable look forward value.

Data access logic device 36 determines time interval 70 by calculating a look back interval and a look forward interval. Specifically, logic device 36 calculates the look back interval by accessing time of day clock 72, accessing the look back value provided by means 82 for establishing a look back value, and subtracting the look back value from the time of day reading. In a similar fashion, logic device 36 calculates the look forward interval by adding a look forward value to the time of day reading. The look back interval is graphically represented in FIG. 2 by historical data segment 16 while the look forward interval is represented by future data segment 22. Data access logic device 36 then accesses first and second instances 51 and 58 of the data structure, communicates the data entries having a start time or end time within the calculated time interval to graphic engine 34 such that graphic engine 34 creates plurality of rivulets 15 normalized to time of day axis indicated by "now" label 20 (FIG. 2).

From the above recited relationships, graphic engine 34 creates river of time 14 as shown in FIG. 2. It will be appreciated by those skilled in the art that the interaction between data access logic device 36, data structure 50, time of day clock 80, and graphic engine 34 may be adapted to create the time and day labels generally indicated by reference numeral 81, a legend 82, and/or a second window 90 for displaying selected information in response to user input.

Legend 82 displays that a variety of visual indicators 84 may be used to communicate the state, status, or other condition of each component or zone of facility 32 shown in FIG. 1. More particularly, a specific color, geometry, or segment size may be selected to correspond to a characteristic of the corresponding system attribute represented within the rivulets. Those skilled in the art will appreciate that a multitude of alternative indicators may be used without departing from the scope of the claimed invention.

It is further contemplated that apparatus 10 (FIG. 1) may include means for establishing an alarm value (not shown) for each of the components and/or zones within facility 32. Data access logic device 36 would then further be adapted to communicate with the means for establishing an alarm value whereby logic device 36 would send an alarm signal in the appropriate instances to graphic engine 34 which would then display the appropriate segment of the appropriate rivulet in a manner indicating that an alarm condition exists.

In order to allow the operator of the facility management system to obtain additional information with respect to certain components and/or zones within facility 32 as desired, apparatus 10 further includes an operator input apparatus 86, e.g., a mouse, communicating with data access logic device 36 and graphic engine 34. Operator manipulation of input apparatus 86 is communicated to graphic engine 34 so as to detect corresponding movement of an indicator 88 (FIG. 2) such as a cursor. It will be appreciated that the operator may manipulate operator input apparatus 86 so as to identify a selected segment of one of the plurality of rivulets 15 whereupon the data access logic device 36 accesses the corresponding portion of memory 26 and conveys preselected data information to graphic engine 34 thereby causing graphic engine 34 to create second window 90 for displaying the selected data for the identified zone or component. In the embodiment shown in FIG. 2, second window 90 displays a component identifier 92, attribute condition 94, start time 96, and an attribute duration 98. In order to provide data access logic device 36 within a component identifier corresponding to each of the n plurality of components within facility 32, apparatus 10 preferably includes means for establishing a component identifier 99 connected to historical data processing module 28 and future data processing module 30.

Figure 3:
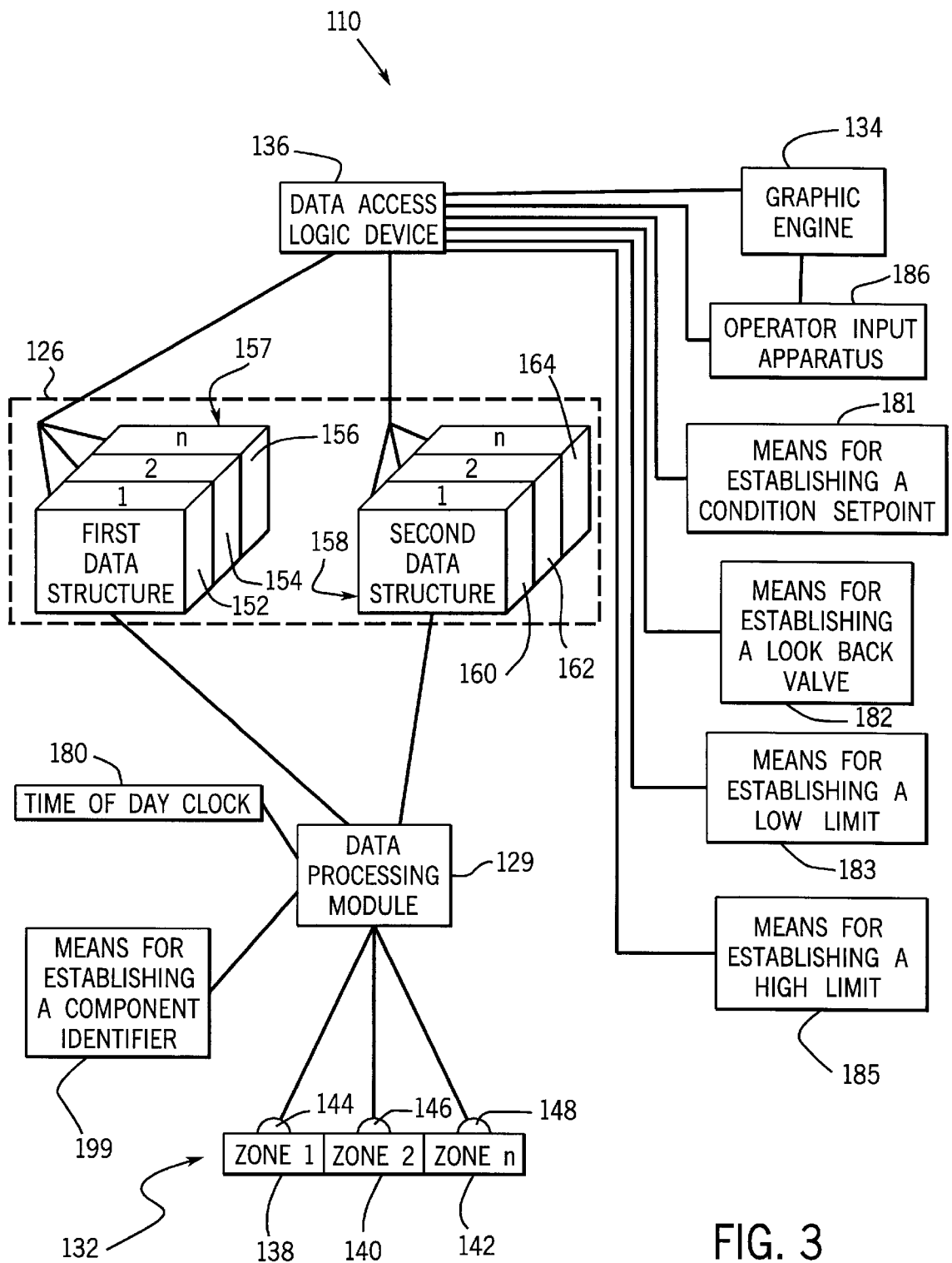
FIG. 3 is a schematic representation of a second embodiment of the computer implemented environmental process control apparatus.
Figure 4:
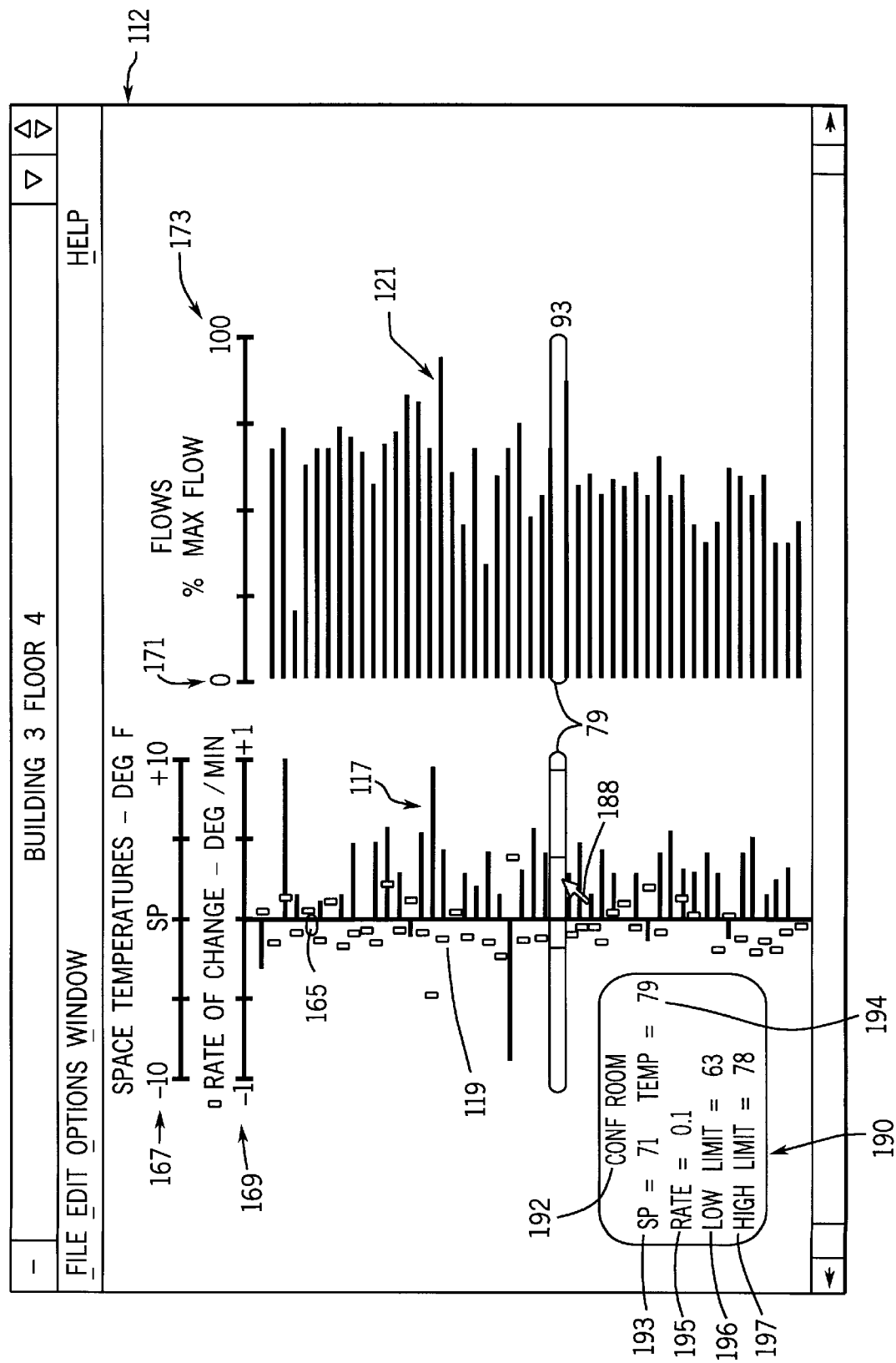
FIG. 4 illustrates a display generated by the control apparatus schematically illustrated in FIG. 3.

Turning now to the embodiment of the invention illustrated in FIGS. 3 15 and 4, FIG. 3 illustrates a computer implemented environmental process control apparatus 110 for displaying an environmental condition in each of n plurality of environmental zones within a display window 112 as is illustrated in FIG. 4. More particularly, apparatus 110, as shown in FIG. 4 and further described herein, includes a graphic engine 134 (FIG. 3) for generating a first axis 165 relative to a first label 167 thereby defining a first scale for first axis 165. Alternatively, a second label 169 is provided relative to first axis 165 so as to define a second scale therefor. In an additional alternative embodiment of apparatus 110 shown in FIG. 4, graphic engine 134 creates a second axis 171 within window 112 and a label 173 so as to establish a scale for second axis 171.

Apparatus 110 is adapted to create a display that allows the operator of facility 132 to again obtain an holistic view of the facility in order to quickly determine the state of the facility and its various components as well as to take a pro-active stance regarding the prevention of alarms or other undesirable conditions. Specifically, in the embodiment illustrated in FIG. 4, apparatus 110 is configured to selectively generate n plurality of first data segments 117, n plurality of indicators 119, and n plurality of second data segments 121. The specific embodiment of apparatus 110 illustrated and described herein is configured to generate the display shown in FIG. 4 wherein first axis 165, first label 167, and first data segments 117 convey the magnitude of the departure of a measured temperature within each zone from a predetermined set point; first axis 165, second label 169, and indicators 119 display the rate of change of the measured temperature; and second axis 171, second label 173, and second data segments 121 indicate the operating state of n plurality of system components each corresponding to one of the n plurality of environmental zones. Notwithstanding the specificity of the display shown in FIG. 4, those skilled in the art will appreciate that a variety of similar environmental conditions, attribute conditions, and the like may be displayed in a multitude of similar fashions so as to provide the desired holistic view of the operation of facility 132 without departing from the scope of the invention described and claimed herein.

FIG. 3 illustrates that apparatus 110 preferably includes a memory 126, a data processing module 129 communicating with a plurality of zones defining a facility 132, a graphic engine 134, and a data access logic device 136 communicating with memory 126 and graphic engine 134. Facility 132 is represented in FIG. 3 by a plurality of zones 1, 2, and n indicated by reference numerals 138, 140, and 142, respectively. Each of zones 1, 2, and n communicate with a control component or sensor 144, 146, and 148, respectively, having a signaling device (not shown) for generating data processing input signals corresponding to measured values within the respective zones of facility 132.

Data processing module 129 is adapted to receive input signals including measured values from each of components 144, 146, and 148, respectively, and to convey the input signals to selected portions of memory 126 as a plurality of data entries. In the preferred embodiment, apparatus 110 is configured to monitor and/or control each of a plurality of system components such as thermostats, fans, condensers, etc. Accordingly, each data entry preferably includes a measured condition value and a time of day reading corresponding to the time when the reading was taken. However, from this description and the appended drawings and claims, those skilled in the art will appreciate that apparatus 110 may be modified to monitor and/or control any number and types of system components, conditions, and the like.

Memory 126 includes a first data structure 151 and a second data structure 158 for storing at least one data entry for each of the plurality of components, sensors, or zones. In the preferred embodiment, first data structure 151 includes a first instance 152 corresponding to first zone 138 or first component or sensor 144, a second instance 154 corresponding to second zone 140 or second component/sensor 146, and an n-th instance 156 corresponding to zone n 142 or component/sensor n 148. In a manner known in the art, data processing module 129 is adapted to receive a measured value indicating signal from one or several of the n components/sensors 144, 146, and 148 and to communicated the measured values to the respective instances 152, 154, and 158 of first data structure 151 in the form of the aforementioned data entries.

Apparatus 110 also preferably includes second data structure 158 for storing second data entries which preferably includes a second measured value for each of the n plurality of zones, components, or sensors. In a manner similar to that described above with respect to first data structure 151, second data structure 158 includes a first instance 160 for storing data entries relating to first zone 138 and/or component/sensor 144 of facility 132, a second instance 162 for storing values relating to second zone 140 and/or second component/sensor 146, and n-th instance 164 corresponding to zone n 142 and/or component/sensor n 148. Data processing module 129 communicates with first data structure 151 and second data structure 158 so as to convey measured values from the respective zones, components, or sensors, to the respective data structures. In this manner, computer implemented environmental process control apparatus 110 is adapted to receive, store, manipulate, and display measured values from n plurality of zones within the HVAC system of facility 132.

Data access logic device 136 is configured to access the data entry in each of first data structure 151 and second data structure 158 and communicate selected information contained in the data entries to graphic engine 134 such that graphic engine 134 creates first data segments 117, data indicators 119, and/or second data segments 121. Specifically data access logic device 136 is adapted to access first data structure 151, retrieve the most recent data entry from first, second and n instances of first data structure 151, access a condition set point from means for establishing a condition set point 181, calculate a departure value for each of the retrieved data entries by subtracting the measured value from the set point, and communicate each of the n plurality of departure values to graphic engine 134 such that graphic engine 134 creates n plurality of first data segments 117. First data segments 117, as shown in FIG. 4, are normalized to and extend from first axis 165 whereby each of the n plurality of first data segments 117 indicate the departure value for each of the corresponding n plurality of zones, components, or sensors relative to the first scale created by first label 167.

As previously mentioned, each of the instances of first and second data structures 151 and 158, respectively, may include one or several first data entries for each of said n plurality of environmental zones. In the embodiment where a plurality of data entries are stored, data processing module 129 communicates with a time of day clock 180 so as to access a time of day reading corresponding to each measured value and communicate the time of day reading and measured values as first data entries to the respective instances of first data structure 151. Further, in order to retrieve the most recent data entry for each zone, component, or sensor, data access logic device 136 is configured to access the time of day from time of day clock 180, identify the data entry in each of the plurality of instances of first data structure 151 that is closest to the time of day, and communicate each of the identified data entries to graphic engine 134 whereby graphic engine 134 creates the n plurality of the first data segments 117 as described above.

In another embodiment of the present invention, apparatus 110 is further configured to create n plurality of indicators 119 each corresponding to one of the n plurality of first data segments 117. In the preferred embodiment, indicator 119 relates to the rate of change of the measured values stored in first data structure 151. Accordingly, in this embodiment, apparatus 110 further includes means for establishing a look back value 182 and a second label 169 that establishes a second scale for first axis 165. Data access logic device 136 is configured to access the time of day from time of day clock 180, access a look back value, calculate a look back start time by subtracting the look back value from the time of day, retrieve from first data structure 151 each of the data entries having a time of day reading between the look back start time and the time of day, calculate a rate of change of the measured value for each of the n plurality of zones, components, or sensors, and communicate the calculated rate of changes to graphic engine 134 such that graphic engine 134 creates n plurality of indicators 119 relative to the second scale of first axis 165.

As is illustrated in FIG. 4, apparatus 110 is further configured to cause graphic engine 134 to create n plurality of second data segments 121 normalized to a second axis 171. In this embodiment, apparatus 110 includes second data structure 158 and, in the manner previously described with respect to the generation of first data segments 117, data access logic device 136 is configured to access second data structure 158 and communicate either the one or most recent data entry for each of the n plurality of environmental zones, components, or sensors to graphic engine 134. As a result, graphic engine 134 creates n plurality of second data segments 121 normalized to second axis 171 and in alignment with the corresponding first segment 117.

As previously described with respect to the first embodiment of computer implemented environmental process control apparatus 10, apparatus 110 may further include an operator input apparatus 186, e.g., a mouse, for identifying at least one of the first and second data segments 117 and 121, respectively, and means for establishing a component identifier 199 communicating with data processing module 129. Specifically, operator manipulation of input apparatus 186 is communicated to graphic engine 134 so as to effect corresponding movement of an indicator 188, e.g., a cursor. It will be appreciated that the operator may manipulate operator input apparatus 186 so as to identify one of the first and second data segments 117 and 121, respectively, whereupon data access logic device 136 accesses the corresponding portion of memory 126 and conveys preselected data information to graphic engine 134 thereby causing graphic engine 134 to create a second window 190 displaying the selected data for the identified zone or component. In the embodiment shown in FIG. 4, second window 190 displays a component identifier 192, a set point 193, a measured temperature value 194, a current rate of change value 195, a low limit 196, and a high limit 197.

Apparatus 110 further includes means for establishing a low limit 183 and means for establishing high limit 185. The high limit and low limit may be displayed within second window 190 as shown in FIG. 4 and used as alarm set points in conjunction with first alarm means for indicating that the measured value is above the high limit and second alarm means for indicating that the measured is below the low limit. It will be appreciated that data access logic device 136 may be configured to signal graphic engine 134 to display one of the corresponding first data segment 117, second data segment 121, or indicator 119 in a manner indicating that an alarm condition exists. It is contemplated that the alarm may be indicated in a multitude of manners known in the art such as by creating the respective segment or indicator in a specific color.

It is to be understood that, while the detailed drawings and specific examples given describe preferred embodiments of the invention, they are for the purpose of illustration only, that the apparatus of the invention is not limited to the precise details and conditions disclosed, and that various changes may be made therein without departing from the spirit of the invention which is defined by the following claims.

What is claimed is:

1. A user interface for an environmental control system, said user interface comprising:

a memory containing a historical data structure and a future data structure, the historical data structure retaining a first plurality of system attribute data representing actual past occurring operating conditions of parts of the environmental control system, and the future data structure retaining a second plurality of system attribute data representing operating conditions that the parts of the environmental control system are to assume in the future;

a clock indicating the real time of day; and a processor coupled to the memory, the clock and to a display device, the display device adapted to display under control of the processor a time reference member depicting the real time of day and a first plurality of display bar members respectively corresponding to the first plurality of system attributes and the first plurality of bar members extending in a first direction from the time member, and a second plurality of display bar members respectively corresponding to the second plurality of system attributes and the second plurality of bar members extending in a second direction from the time member.

2. The interface of claim 1 wherein a size attribute of a display bar member corresponds to a characteristic of the corresponding system attribute.

3. The interface of claim 1 wherein a color attribute of a display bar member corresponds to a characteristic of the corresponding system attribute.

4. The interface of claim 1 wherein each of the first plurality of system attributes represents a data attribute of an environmental zone of a HVAC system.

5. The interface of claim 4 wherein each of the first plurality of system attributes represents an historical data entry.

6. The interface of claim 1 wherein each of the second plurality of system attributes represents a data attribute of an environmental zone of a HVAC system.

7. The interface of claim 6 wherein each of the second plurality of system attributes represents a future data entry.

8. The interface of claim 1 wherein the display device is further adapted to, in response to a user's input, display a detailed listing of a plurality of characteristics of a system attribute.

9. The interface of claim 1 wherein the first plurality of system attributes comprise a set of time based attribute data and wherein the first set of bar members comprise a representation of a portion of the set of time based attribute data.

10. A computer implemented environmental process control apparatus for displaying the condition of selected attributes of a plurality of N environmental control components, the environment having a plurality of zones each with a control component communicating therewith, each control component being adapted to transmit an attribute condition indicating signal to said control apparatus, said control apparatus comprising:

a memory including:

a data structure for storing a plurality of data entries for each of said plurality of N components, said data entries including an attribute condition, start, and end;

a plurality of N first instances of said data structure for storing historical data for each of said plurality of N components, where N is a positive integer; and a plurality of N second instances of said data structure for storing future data for each of said plurality of N components;

a time of day clock;

means for establishing a look back value;

means for establishing a look forward value;

an historical data processing module with a field input adapted to receive an attribute condition indicating signal from each of said plurality of N components, said historical data processing module coupled to said first instance of said data structure to communicate said historical data thereto;

a future data processing module adapted to receive user input corresponding to the desired attribute condition of said plurality of N components, said future data processing module coupled to said second instance of said data structure to communicate said future data thereto;

a graphic engine that creates a first window and a time of day axis within said first window; and a data access logic device that accesses historical data from said plurality of N first instances of said data structure and future data from said plurality of N second instances of said data structure and communicates said historical and future data to said graphic engine such that said graphic engine creates a plurality of rivulets normalized to said time of day axis, each of said plurality of rivulets including an historical data segment extending from said time of day axis in a first direction and a future data segment extending from said time of day axis in a second direction opposite said first direction, said data access logic device configured to access a time of day from said time of day clock, access said look back value, calculate a look back start time by subtracting said look back value from said time of day, access said look forward value, and calculate a look forward end time by adding said look forward value to said time of day, said data access logic device configured to access said plurality of N first instances of said data structure and communicate each of said data entries therein having at least one of said start and said end between said look back start time and said time of day to said graphic engine such that said graphic engine creates said plurality of historical data segments, and said data access logic device configured to access said plurality of N second instances of said data structure and communicate each of said data entries therein having at least one of a start and end between said time of day and said look forward end time to said graphic engine such that said graphic engine creates said plurality of future data segments.

11. The control apparatus of claim 10 wherein said data access logic device is further configured to communicate said time of day to said graphic engine such that said graphic engine creates a first label displaying said time of day proximate to said time of day axis.

12. The control apparatus of claim 10 wherein said plurality of historical data segments each include an historical data section for each of said data entries in said plurality of N first instances of said data structure having at least one of said start and end between said look back start time and said time of day and wherein said plurality of future data segments include a future data section for each of said data entries in said plurality of N second instances of said data structure having at least one of said start and end between said time of day and said look forward end time.

13. The control apparatus of claim 12 wherein said graphic engine further creates a legend within said first window displaying a plurality of visual indicators, each of said plurality of visual indicators corresponding to an attribute condition for said plurality of N components, and wherein each of said historical data sections and future data sections include the visual indicator for the attribute condition in the corresponding data entry.

14. The control apparatus of claim 12 further including an operator input apparatus for identifying at least one of said historical and future data sections and means for establishing a component identifier for each of said plurality of N components and wherein said data access logic device is further adapted to communicate with said operator input apparatus, access said component identifier and the data entry for said at least one of said historical and future data sections identified by said operator input apparatus, and communicate said component identifier and said identified data entry to said graphic engine such that said graphic engine creates a second window displaying said component identifier and the attribute condition of said identified data entry.

15. The control apparatus of claim 14 wherein said second window further displays said start and end of said identified data entry.

16. The control apparatus of claim 14 wherein said means for establishing a component identifier includes an interface processing module adapted to convey user input of said component identifier to said historical data processing module and said future data processing module.

17. The control apparatus of claim 10 wherein said means for establishing a look forward value includes an interface processing module adapted to receive user input of said look forward value.

18. The control apparatus of claim 10 further including a control logic device that communicates with said plurality of N components, accesses said plurality of N second instances of said data structure, accesses said time of day clock, identifies each data entry in said plurality of N second instances of said data structure having a start equal to said time of day, and places the attribute of each of said plurality of N components corresponding to each identified data entry into the attribute condition of the data entry.

19. A computer implemented environmental process control apparatus for displaying an environmental condition in each of a plurality of N environmental zones, where N is a positive integer, a sensor communicating with said plurality of N environmental zones, said sensor adapted to measure the condition in each of said plurality of N environmental zones and to transmit a measured value to said control apparatus, said control apparatus comprising:

a memory including a first data structure for storing a first data entry for each of said plurality of N zones, each of said first data entries including a first measured value;

means for establishing a condition set point for each of said plurality of N environmental zones;

a data processing module with a field input adapted to receive said first measured values from the sensors in each of said plurality of N environmental zones, said data processing module coupled to said first data structure to supply said first measured values thereto;

a graphic engine that creates a first window, a first axis within said window, and a first label establishing a first scale for said first axis;

a data access logic device that accesses said first data structure, retrieves said first data entry for each of said plurality of N environmental zones, accesses said condition set point, calculates a plurality of N departure values by subtracting said first measured value from said set point for each of said plurality of N zones, and communicates said plurality of N departure values to said graphic engine such that said graphic engine creates a plurality of N first segments normalized to and extending from said first axis whereby each of said plurality of N segments indicate the departure value for each of said plurality of N zones relative to said first scale; and a real time of day clock, wherein said first data structure stores a plurality of first data entries for each of said plurality of N environmental zones, wherein each of said first data entries further include a real time of day reading, wherein said data processing module is coupled to said real time of day clock and adapted to retrieve said real time of day reading in response to receiving each of said first measured values, associate said real time of day reading with each of said first measured values to create said first data entries, and communicate said first data entries to said first data structure, and wherein said data access logic device accesses said first data structure, accesses said real time of day, identifies the data entry for each of said plurality of N zones that is closest to said real time of day, and communicates each of said plurality of N identified data entries to said graphic engine whereby said graphic engine creates said plurality of N first segments.

20. The control apparatus of claim 19 further including means for establishing a look back value, wherein said graphic engine creates a second label establishing a second scale for said first axis, and wherein said data access logic device accesses said real time of day from said real time of day clock, accesses said look back value, calculates a look back start time by subtracting said look back value from said real time of day, accesses said first data structure, retrieves each of said first data entries in said first data structure having a real time of day reading between said look back start time and said real time of day, calculates a rate of change of said first measured values for each of said plurality of N zones, and communicates said rate of changes to said graphic engine such that said graphic engine creates an indicator associated with each of said first segments to indicate the rate of change of said environmental condition in said plurality of N zones relative to said second scale.

21. The control apparatus of claim 19 further including means for establishing a high limit and a low limit for each of said plurality of N environmental zones, first alarm means for indicating that said measured value is above said high limit, and second alarm means for indicating that said measured value is below said low limit.

22. The control apparatus of claim 21 wherein said first alarm means includes said data access logic device accessing said high limit and said first measured value for each of said plurality of N zones, subtracting each of said first measured values from each of said high limits, and causing said graphic engine to create said first segments in a first color when said high limit less said first measured value is less than zero and wherein said second alarm means includes said data access logic device accessing said low limit and said first measured value for each of said plurality of N zones, subtracting each of said measured values from each of said low limits, and causing said graphic engine to create said first segments in a second color when said low limit less said first measured value is greater than zero.

23. The control apparatus of claim 19 wherein said first condition is the temperature in each of said plurality of N environmental zones.

24. The control apparatus of claim 19 further including a second data structure for storing a second data entry having a second measured value for each of said plurality of N zones, wherein said data processing module is adapted to receive said second measured values from said sensors and is coupled to said second data structure to communicate said second measured values thereto, wherein said graphic engine creates a second axis within said first window and a label establishing a scale for said second axis, and wherein said data access logic device accesses said second data structure, retrieves said second data entries for each of said plurality of N environmental zones, and communicates said plurality of N second data entries to said graphic engine such that said graphic engine creates a plurality of N second segments, said second segment for each of said plurality of N environmental zones being normalized to said second axis and in alignment with said first segment thereof.

25. The control apparatus of claim 24 wherein said control apparatus further includes an operator input apparatus for identifying at least one of said first and second segments and means for establishing a component identifier for each of said plurality of N components, and wherein said data access logic device is further adapted to communicate with said operator input apparatus, access said component identifier and the first and second data entries for said at least one of said first and second segments identified by said operator input apparatus, and communicate said component identifier and said identified first and second data entries to said graphic engine such that said graphic engine creates a second window displaying said component identifier and the measured values of said identified first and second data entries.

26. The control apparatus of claim 19 wherein said control apparatus further includes an operator input apparatus for identifying at least one of said segments and means for establishing a component identifier for each of said plurality of N components, and wherein said data access logic device is further adapted to communicate with said operator input apparatus, access said component identifier and the data entry for said at least one of said segments identified by said operator input apparatus, and communicate said component identifier and said identified data entry to said graphic engine such that said graphic engine creates a second window displaying said component identifier and the measured value of said data entry.

27. The control apparatus of claim 26 wherein said second window further displays said low limit and said high limit of said data entry.

* * * * *